(12) United States Patent
Jung et al.

(10) Patent No.: US 7,486,397 B2
(45) Date of Patent: Feb. 3, 2009

(54) DEVICE FOR ALIGNING SUBSTRATE WITH MASK AND METHOD USING THE SAME

(75) Inventors: Sung Wha Jung, Gyeonggi-do (KR); Sang Jin Han, Gyeonggi-do (KR); Eu Gene Kang, Gyeonggi-do (KR)

(73) Assignee: Samsung Mobile Display Co., Ltd., Suwon (KR)

( * ) Notice: Subject to any disclaimer, the term of this patent is extended or adjusted under 35 U.S.C. 154(b) by 176 days.

(21) Appl. No.: 11/324,247

(22) Filed: Jan. 4, 2006

(65) Prior Publication Data

US 2006/0146329 A1   Jul. 6, 2006

(30) Foreign Application Priority Data

Jan. 5, 2005    (KR)    ...................... 10-2005-0000947

(51) Int. Cl.
*G01B 11/00*    (2006.01)
*G01B 9/02*    (2006.01)

(52) U.S. Cl. ...................... 356/401; 356/399; 356/400; 356/485; 356/490

(58) Field of Classification Search ......... 356/399–401; 438/401; 257/797; 430/5, 22, 30; 355/53, 355/55, 57; 382/151
See application file for complete search history.

(56) References Cited

U.S. PATENT DOCUMENTS 3,555,172 A * 1/1971 Heinz ........................... 348/95
4,037,969 A * 7/1977 Feldman et al. ............. 356/401
5,243,195 A    9/1993 Nishi
RE36,730 E * 6/2000 Nishi .......................... 250/548
6,078,641 A * 6/2000 Mitsui et al. ................... 378/34
6,294,296 B1 * 9/2001 Weigl ............................ 430/22
6,294,892 B1 * 9/2001 Utsugi et al. ................. 318/640
6,436,595 B1    8/2002 Credendino et al.
6,727,979 B2 * 4/2004 Kobayashi et al. ............. 355/53
6,768,107 B2 * 7/2004 Schultz et al. ............... 250/288
6,983,872 B2 * 1/2006 Cheng et al. ..................... 228/8

FOREIGN PATENT DOCUMENTS

JP    2004-027291 A1    1/2004
TW    200416500        9/2004
TW    200424749        11/2004

OTHER PUBLICATIONS

Chinese Office Action dated Jul. 4, 2008.

* cited by examiner

*Primary Examiner*—L. G Lauchman
*Assistant Examiner*—Jarreas C Underwood
(74) *Attorney, Agent, or Firm*—H.C. Park & Associates, PLC

(57) ABSTRACT

A device for aligning a substrate and a mask, and a method using the same, where the device includes aligning marks in unused portions of the substrate and the mask, a sensing unit for determining overlap of the aligning marks when the substrate is aligned with the mask, and a control unit for controlling an aligning process to be repeated on the basis of data sensed and determined by the sensing unit. The sensing unit may include a camera positioned in photographic range to determine any alignment error in the alignment marks. According to another embodiment of the present invention, the alignment error between the substrate and the mask is sensed to determine whether it is acceptable or not. When the alignment error is unacceptable, the operations for aligning the substrate with the mask are repeated until the alignment error is acceptable.

17 Claims, 3 Drawing Sheets

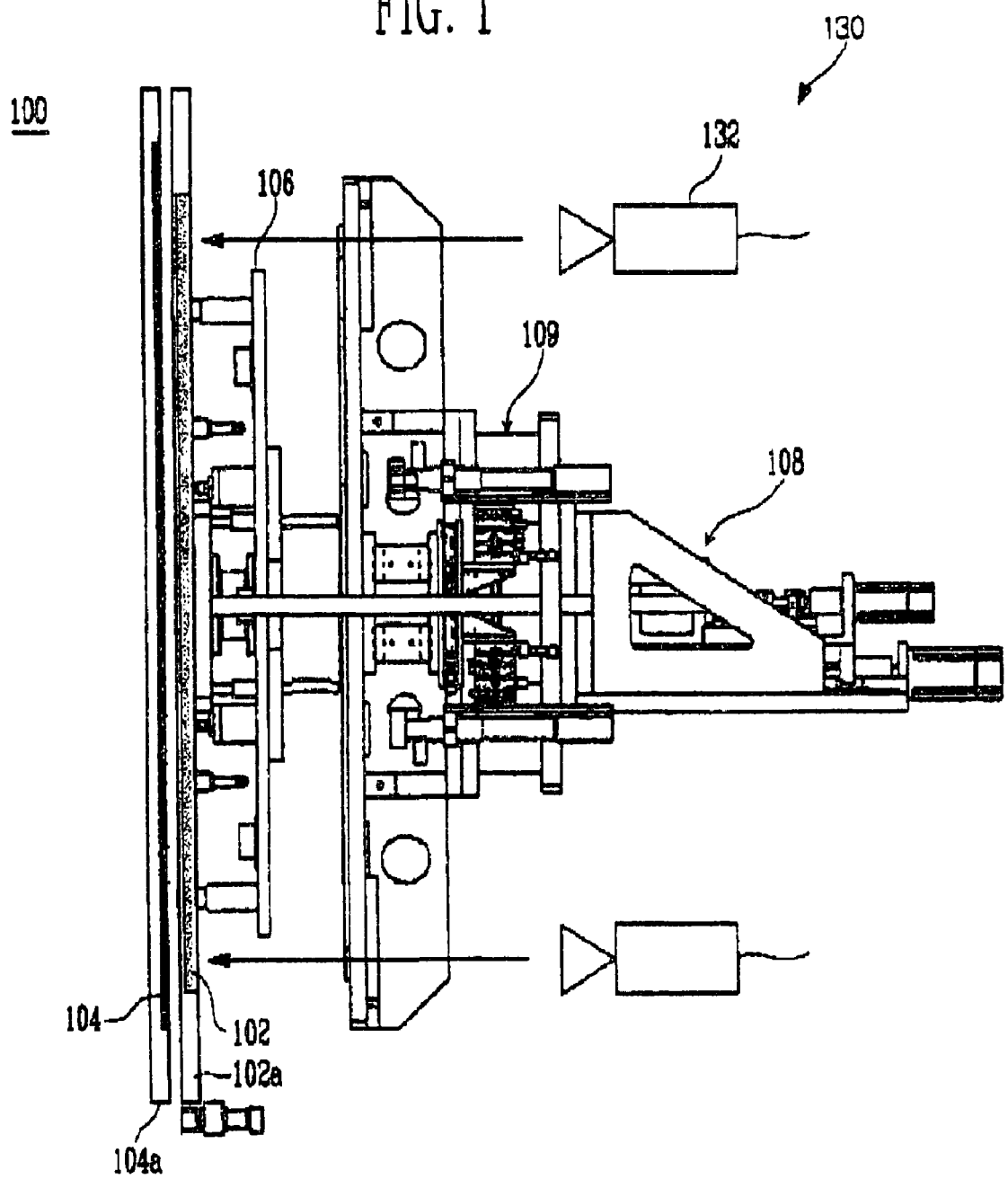

DEVICE FOR ALIGNING SUBSTRATE WITH MASK AND METHOD USING THE SAME

CROSS REFERENCE TO RELATED APPLICATION

This application claims priority to and the benefit of Korean Patent Application No. 2005-0000947, filed Jan. 5, 2005, which is hereby incorporated by reference for all purposes as if fully set forth herein.

BACKGROUND OF THE INVENTION

1. Field of the Invention

The present invention relates to a substrate and a mask, and more particularly, to a device for aligning a substrate and a mask and a method using the same.

2. Discussion of the Background

As a type of flat panel display, an electroluminescent display can be classified as an inorganic electroluminescent display or an organic electroluminescent display, depending upon materials used for an emission layer. The organic electroluminescent display is attracting attention because it can be driven with a low voltage, have a low weight and be thin, have a wide view angle, and have fast response time.

A conventional organic electroluminescent display includes an organic electroluminescent device with an anode, an organic material layer, and a cathode, which are stacked on a substrate. The organic material layer includes an organic emission layer, which emits visible light by hole and electron recombination. Further, to transport the hole and the electron to the emission layer and enhance emission efficiency, an electron injection layer and an electron transporting layer can be interposed between the cathode and the organic emission layer, and a hole injection layer and a hole transporting layer can be interposed between the anode and the organic emission layer.

An organic electroluminescent device with this configuration can be fabricated by a physical vapor deposition method, such as a vacuum deposition method, an ion plating method, or a sputtering method, or by a chemical vapor deposition method using a gas reaction. The vacuum deposition method has been widely used to deposit an organic gaseous material on the substrate by evaporating an organic material in a vacuum. Such a vacuum deposition method employs an effusion cell to effuse the organic gaseous material evaporated in a vacuum chamber onto the substrate. Thus, the organic material layer of the organic electroluminescent device can be formed.

Recently, the size of the substrate has been enlarged for manufacture of a large-sized display. Accordingly, a deposition system has been developed to deposit the organic material layer on the larger substrate, where the effusion cell moves vertically in the vacuum chamber and effuses the organic gaseous material.

This deposition system includes a driving shaft to move the effusion cell vertically, and the driving shaft rotates about an axis by a driving means. As the driving shaft is rotated about the axis, the effusion cell moves vertically and effuses the organic gaseous material obtained by evaporating the organic material.

Further, to prevent a large substrate from sagging during the effusion of the organic gaseous material, a vertical aligning system of aligning the substrate with the mask in a standing state can be used.

Accordingly, a device for precisely moving the effusion cell applied to the vertical aligning system and an aligning method using the same are necessary.

SUMMARY OF THE INVENTION

This invention provides a device for aligning a substrate and a mask by moving the effusion cell applied to the vertical aligning system and an aligning method using the same.

Additional features of the invention will be set forth in the description which follows, and in part will be apparent from the description, or may be learned by practice of the invention.

The present invention discloses a device for aligning a substrate and a mask including a first aligning mark positioned in an unused portion of the substrate, a second aligning mark positioned in an unused portion of the mask, a sensing unit to sense the position of the first aligning mark in relation to the second aligning mark when the substrate is aligned with the mask by a driving unit and a stage, and a control unit for controlling a subsequent process to be performed and an aligning process to be repeated on the basis of data sensed and determined by the sensing unit.

The present invention discloses a method for aligning a substrate for an emission device and a mask, including attaching a substrate with a first aligning mark to a mask with a second aligning mark, aligning the second aligning mark approximately over the first aligning mark, sensing an alignment error between the first aligning mark and the second aligning mark, detaching the substrate from the mask and adjusting the relative position of the substrate and the mask to reduce the alignment error where the alignment error is unacceptable according to predetermined criteria.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the principles of the invention.

FIG. 1 shows an aligning device according to an embodiment of the present invention to align a substrate for an emission device and a mask.

DETAILED DESCRIPTION OF ILLUSTRATED EMBODIMENTS

Figure 2A:
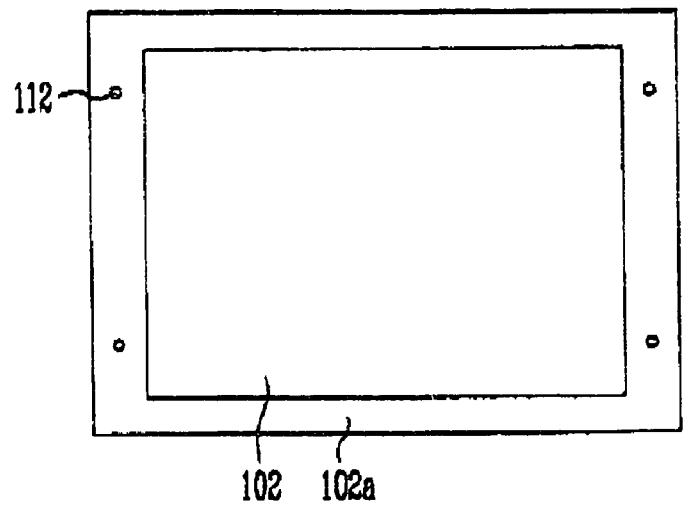
FIG. 2A and FIG. 2B show front views of a substrate and a tray according to an embodiment of the present invention.

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure is thorough, and will fully convey the scope of the invention to those skilled in the art. In the drawings, the size and relative sizes of layers and regions may be exaggerated for clarity.

Figure 2B:
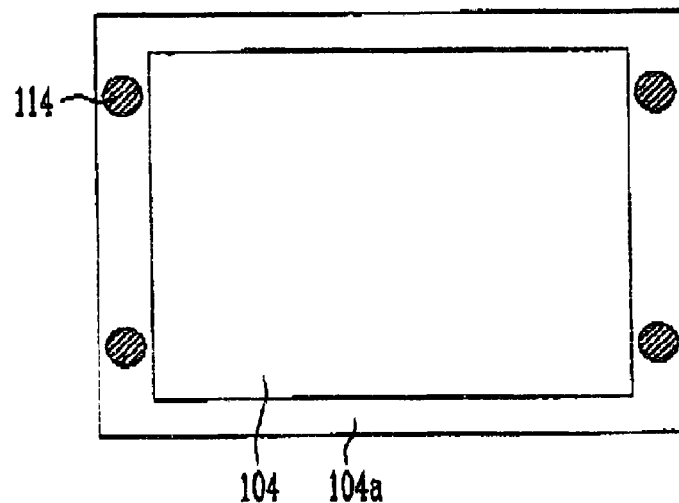
Figure 2C:
FIG. 2C shows an enlarged view of an aligning mark between the substrate and the tray of FIG. 2A and FIG. 2B.
Figure 3:
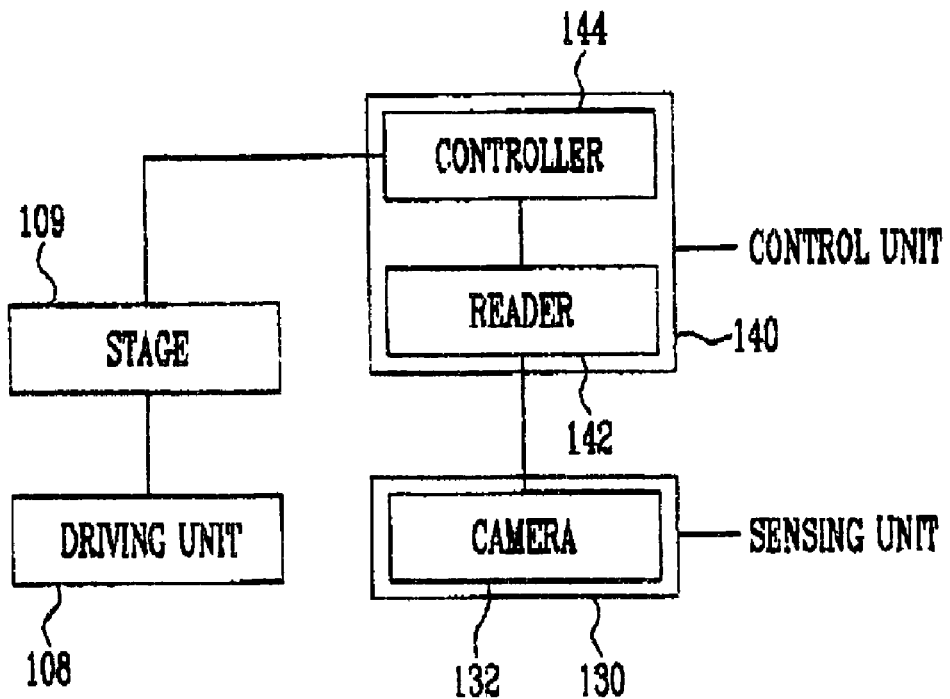
FIG. 3 shows a block diagram of the aligning device according to an embodiment of the present invention.

FIG. 1 shows an aligning device according to an embodiment of the present invention to align a substrate for an emission device and a mask. FIG. 2A and FIG. 2B show front views of a substrate and a tray according to an embodiment of the present invention. FIG. 2C shows an enlarged view of an aligning mark between the substrate and the tray of FIG. 2A and FIG. 2B. FIG. 3 shows a block diagram of the aligning device according to an embodiment of the present invention.

An aligning device 100 according to an embodiment of the present invention for aligning a substrate 102 for an emission device and a mask 104 includes aligning marks 110, including a substrate mark 112 and a mask mark 114, respectively marked in unused portion 102a of a substrate 102 and unused portion 104a of a mask 104 in a standing state; a sensing unit 130 to photograph whether the substrate mark 112 of the substrate 102 and the mask mark 114 of the mask 104 overlap each other when the substrate 102 is held by a holder 106 and aligned with the mask 104 by a driving unit 108; and a control unit 140 to determine whether the substrate mark 112 and the mask mark 114 are precisely aligned on the basis of sensed data, and to control the driving unit 108 and a stage 109 to finely adjust the substrate 102.

As shown in FIG. 1, the sensing unit 130 includes a camera 132 to photograph the substrate mark 112 and a mask mark 114 marked on the substrate 102 and the mask 104 and aligned with each other when the substrate 102 is attached to the mask 104.

As shown in FIG. 2A, FIG. 2B, and FIG. 2C, the aligning marks 110 are marked on the edges of the substrate 102, referred to as the unused portion 102a, and the edges of the mask 104, referred to as the unused portion 104a. As shown, the aligning marks 110 include a substrate mark 112 with a diameter of about 0.3 mm and used as an aligning point, and a mask mark 114 with a diameter of about 1 mm and used as a reference point. Thus, an alignment error between the substrate 102 and the mask 104 can be obtained by calculating a position of the substrate mark 112 with respect to the mask mark 114. For example, when the center of the mask mark 114 is aligned with the center of the substrate mark 112, the alignment error is '0'. Here, the aligning point and the reference point are defined for convenience as the substrate mark 112 and the mask mark 114 respectively.

The camera 132 is fixed regardless of the movement of the driving unit 108 and the stage 109, and positioned corresponding to the aligning marks 110 and within photographing range of the substrate 102 and the mask 104.

The driving unit 108 drives the substrate 102 to move frontward and backward, and finely adjusts the stage 109 in vertical and horizontal directions.

The control unit 140 includes a reader 142, which processes image data received from the camera 132 and determines whether the alignment error between the substrate 102 and the mask 104 is acceptable. The control unit 140 further includes a controller 144, which controls the driving unit 108 and the stage 109 to operate on the basis of the determined alignment error.

When the reader 142 determines that the alignment error between the substrate 102 and the mask 104 is unacceptable, the controller 144 controls the driving unit 108 to remove the substrate 102 from the mask 104, and the stage 109 to adjust for the alignment error, thereby repositioning the substrate 102 into the compensated position. Then, the controller 144 controls the driving unit 108 to align the substrate 102 and the mask 104 at the compensated position.

After aligning the substrate 102 with the mask 104 at the compensated position, the camera 132 again photographs the aligning marks 110 and the reader 142 again determines the alignment error. If the alignment error is again not acceptable, the controller 144 controls the driving unit 108 and the stage 109 to correct for the new alignment error, and aligns the substrate 102 and the mask 104.

Conversely, when the reader 142 determines that the alignment error between the substrate 102 and the mask 104 is acceptable, the alignment process is complete and a predetermined process may be performed while the substrate 102 is aligned with the mask 104.

A method of aligning the substrate and the mask using the aligning device according to an embodiment of the present invention will be described with reference to FIG. 4.

Figure 4:
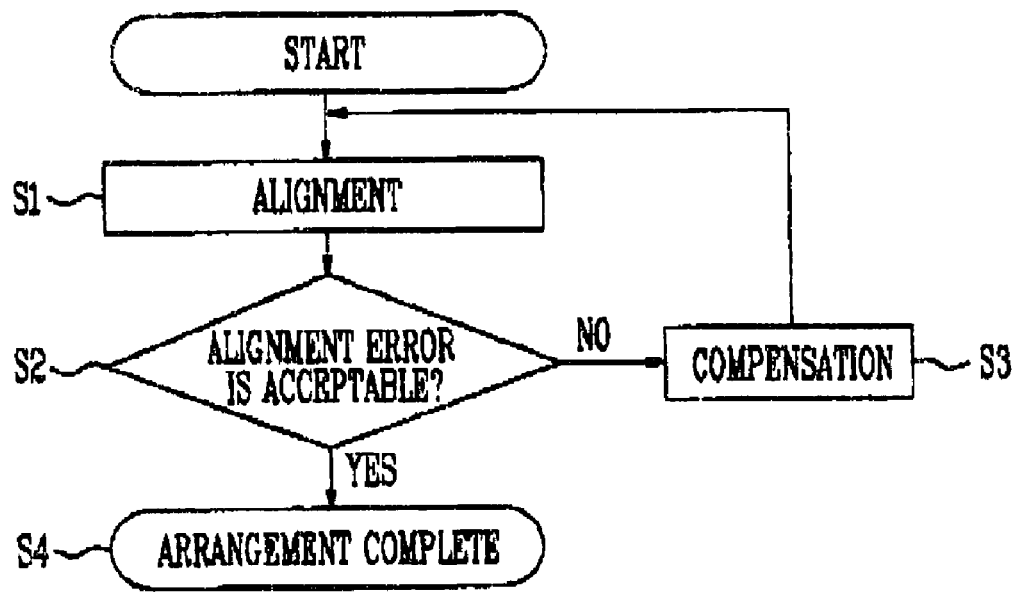
FIG. 4 shows a flowchart for aligning the substrate and the mask through the aligning device according to an embodiment of the present invention.

Referring to FIG. 4, at operation S1, the substrate 102 moves close to the mask 104, to a distance of, for example, about 3 μm. At operation S2, the substrate 102 is attached to the mask 104, and the alignment error of the aligning marks 110 between the substrate 102 and the mask 104 is sensed. When the alignment error is not acceptable in the operation S2, at operation S3 the alignment error is compensated wherein the substrate 102 is spaced apart from the mask 104, and then the operation returns to the operation S1, wherein the substrate 102 moves close to the mask 104, to a distance of, for example, about 3 μm, in a position that corrects for the previously sensed alignment error. Conversely, when the alignment error is acceptable in the operation S2, at operation S4 the alignment between the substrate 102 and the mask 104 is completed.

After alignment is complete, predetermined processes may be performed while the substrate 102 is aligned with the mask 104.

Below, the above described operations will be described in more detail.

The driving unit 108 of the aligning device 100 drives the substrate 102 to a position close to the mask 104, and then the stage 109 adjusts the substrate 102 to align and the mask 104.

As the substrate 102 and the mask 104 are aligned with each other, the mask mark 114 and the substrate mark 112 become approximately aligned. Then, the camera 132 photographs the mask mark 114 and the substrate mark 112, and the reader 142 determines the alignment error between the substrate 102 and the mask 104.

If the reader 142 determines that the alignment error is not acceptable according to predetermined criteria, the driving unit 108 drives the substrate 102 to a position apart from the mask 104, and then the stage 109 compensates for the alignment error, thereby repositioning the substrate 102 to the compensated position.

Thus, the substrate 102 is adjusted while being spaced apart from the mask 104. Then, the driving unit 108 drives the substrate 102 to move close to the mask 104, at approximately a distance of 3 μm.

On the other hand, if the alignment error based on the previously sensed data and the compensation is acceptable, the alignment between the substrate 102 and the mask 104 is completed. Subsequently, predetermined processes are applied to the substrate 102 while aligned with the mask 104.

As described above, according to an embodiment of the present invention, the alignment error between the substrate and the mask is sensed to determine whether it is acceptable according to predetermined criteria. When the alignment error is unacceptable, the operations for aligning the substrate and the mask are repeated until the alignment error is acceptable. Thus, the substrate can be precisely aligned with the mask, thereby remarkably reducing defects due to unacceptable alignment error.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. A device for aligning an organic electroluminescence display substrate and a mask, comprising:
    a driving unit;
    a stage;
    a sensing unit to sense data, the data comprising a position of a first aligning mark in relation to a second aligning mark after the organic electroluminescence display substrate and the mask are aligned by the driving unit and the stage; and
    a control unit to control an aligning process to be performed on the basis of the data sensed by the sensing unit, the alignment process comprising correcting for a vertical alignment error between the first aligning mark and the second aligning mark,
    wherein the first aligning mark is positioned in an unused portion of the organic electroluminescence display substrate and the second aligning mark is positioned in an unused portion of the mask.

2. The device of claim 1, wherein the organic electroluminescence display substrate is aligned with the mask if the first aligning mark and the second aligning mark are concentrically aligned.

3. The device of claim 2, wherein the sensing unit comprises a first camera to photograph the position of the first aligning mark in relation to the second aligning mark.

4. The device of claim 3, wherein the sensing unit further comprises a second camera to photograph a position of a third aligning mark positioned in the unused portion of the organic electroluminescence display substrate in relation to a fourth aligning mark positioned in the unused portion of the mask.

5. The device of claim 1, wherein the control unit comprises:
    a reader to image data received from the sensing unit and to determine whether the vertical alignment error or a horizontal alignment error between the organic electroluminescence display substrate and the mask is unacceptable; and
    a controller to control the driving unit and the stage to operate on the basis of a determined result of the reader.

6. The device of claim 5, wherein the control unit controls the driving unit and the stage to space the organic electroluminescence display substrate apart from the mask and to compensate for the vertical alignment error or the horizontal alignment error if the reader determines that the vertical alignment error or the horizontal alignment error is unacceptable.

7. The device of claim 3, wherein the control unit comprises:
    a reader to image data received from the sensing unit and to determine whether the vertical alignment error or the horizontal alignment error between the organic electroluminescence display substrate and the mask is unacceptable; and
    a controller to control the driving unit and the stage to operate on the basis of a determined result of the reader.

8. The device of claim 7, wherein the control unit controls the driving unit and the stage to space the organic electroluminescence display substrate apart from the mask and to compensate for the vertical alignment error or the horizontal alignment error if the reader determines that the alignment error is unacceptable.

9. A method for aligning an organic electroluminescence display substrate and a mask, comprising:
    positioning the organic electroluminescence display substrate with a first aligning mark adjacent to a mask with a second aligning mark;
    aligning the second aligning mark approximately with the first aligning mark;
    sensing a vertical alignment error between the first aligning mark and the second aligning mark; and
    detaching the organic electroluminescence display substrate from the mask and adjusting the relative position of the organic electroluminescence display substrate and the mask to reduce the vertical alignment error if the vertical alignment error is unacceptable.

10. The method of claim 9, wherein the adjusting comprises:
    moving the organic electroluminescence display substrate to align with the mask.

11. The method of claim 9, wherein the adjusting comprises:
    moving the mask to align with the organic electroluminescence display substrate.

12. The device of claim 1, wherein the organic electroluminescence display substrate is arranged vertically.

13. The device of claim 1, wherein the mask is arranged vertically.

14. The device of claim 1, wherein the alignment process further comprises correcting for a horizontal alignment error between the first aligning mark and the second aligning mark.

15. The method of claim 9, wherein the organic electroluminescence display substrate is arranged vertically.

16. The method of claim 9, wherein the mask is arranged vertically.

17. The method of claim 9, further comprising:
    sensing a horizontal alignment error between the first aligning mark and the second aligning mark; and
    adjusting the relative position of the organic electroluminescence display substrate and the mask to reduce the horizontal alignment error if the horizontal alignment error is unacceptable.

* * * * *